United States Patent [19]

Kouda

[11] Patent Number: 4,803,541
[45] Date of Patent: Feb. 7, 1989

[54] SEMICONDUCTOR DEVICE

[75] Inventor: Toyomasa Kouda, Takasaki, Japan

[73] Assignee: Hitachi, Ltd., Tokyo, Japan

[21] Appl. No.: 178,847

[22] Filed: Apr. 4, 1988

Related U.S. Application Data

[63] Continuation of Ser. No. 728,201, Apr. 29, 1985.

[30] Foreign Application Priority Data

May 23, 1984 [JP]  Japan ................. 59-102567

[51] Int. Cl.⁴ ............... H01L 29/78; H01L 29/90; H01L 29/40; H01L 23/48
[52] U.S. Cl. ................... 357/68; 357/23.13; 357/53; 357/48; 357/13
[58] Field of Search .......... 357/23.13, 68, 13, 48, 357/53

[56] References Cited

U.S. PATENT DOCUMENTS

| | | | |
|---|---|---|---|
| 3,582,727 | 6/1971 | Granger | 357/48 |
| 3,961,358 | 6/1976 | Polinsky | 357/53 |
| 4,080,616 | 3/1978 | Horie | 357/13 |
| 4,523,372 | 6/1985 | Balda et al. | 357/71 |
| 4,578,695 | 3/1986 | Delaporte et al. | 357/48 |

FOREIGN PATENT DOCUMENTS 25466  7/1971  Japan ...................... 357/65

OTHER PUBLICATIONS

Davis, IEEE Journal of Solid State Circuits, Dec. 1973, p. 424.
Hamilton & Howard, "Basic Integrated Circuit Engineering", copyright 1975, p. 26.

Primary Examiner—Andrew J. James
Assistant Examiner—Jerome Jackson
Attorney, Agent, or Firm—Antonelli, Terry & Wands

[57] ABSTRACT

A semiconductor device wherein a semiconductor region which is electrically floating is provided in the main surface of a semiconductor substrate under a bonding pad. This construction helps prevent short-circuiting between the semiconductor substrate and the bonding pad, which is liable to occur when the wires are to be bonded. Resistance elements and elements for preventing electrostatic breakdown are also formed in an island region in which is formed the floating semiconductor region. Therefore, vicinities of bonding pads, that were not utilized thus far for forming elements, can now be effectively utilized to increase the degree of integration.

24 Claims, 12 Drawing Sheets

SEMICONDUCTOR DEVICE

This application is a continuation application of application Ser. No. 728,201, filed Apr. 29, 1985.

BACKGROUND OF THE INVENTION

The present invention relates to a semiconductor device, and particularly to a semiconductor integrated circuit device, hereinafter referred to as an IC, having a plurality of bonding pads formed on a semiconductor chip.

Semiconductor devices in general have a construction in which a semiconductor chip is secured onto a lead frame, and the external leads and the semiconductor chip are electrically connected together via wires having good electrical conductivity such as gold wires.

The region for connecting the wire in the semiconductor chip is called the bonding pad and is usually obtained by forming a layer of metal such as aluminum on an oxide film covering the surface of a semiconductor substrate, and forming an aperture in a portion of a final passivation film that covers the metal layer, such that the surface of a portion of the metal layer is exposed.

As is well known, the electric connection (bondability) between the bonding pad and the wire is an important parameter that greatly affects the characterististics of the semiconductor device. A variety of wire-bonding methods have been developed to obtain good connection between the two. However, all of such methods contain a scrubbing step in which the tip of wire and the bonding pad are strongly scrubbed relative to each other.

The thickness of the oxide film on the surface of the semiconductor substrate has decreased as the size of modern semiconductor devices has decreased. Therefore, if a load is applied to the wire and the bonding pad is scrubbed by the wire in the scrubbing step contained in the step of wire bonding, the pressure is transmitted to a thin oxide film which covers the surface of the semiconductor substrate under the bonding pad, so that the oxide film is destroyed or pinholes are formed.

Development of such defects substantially shortcircuits the wire and the semiconductor substrate so that the signals are not effectively transmitted to the elements formed in the semiconductor substrate.

Japanese Patent Publication No. 25466/1971 proposes a solution to the above-mentioned problem, as shown in FIG. 19. Namely, a silicon n⁻-layer 4 is epitaxially grown on a single crystalline silicon p⁻-substrate 1. The silicon n⁻-layer is electrically isolated by p-isolation layers 8 into several semiconductor island regions in which will be formed elements such as transistors. An aluminum electrode (wiring) 16 connected to these elements is connected to a bonding pad 2 in the vicinity of the chip (substrate), and a wire 19 is bonded between the bonding pad 2 and an external lead, thereby constituting an IC. The bonding pad 2 is formed on an $SiO_2$ film 10 which is an insulating film on the surface of the silicon layer 4. If pinholes exist in the $SiO_2$ film under the bonding pad, a leakage current flows into the semiconductor layer 4 through pinholes to adversely affect the circuits that constitute an IC. In order to prevent such a leakage current from flowing, the above-mentioned literature discloses an art according to which a p-isolation layer 8 is formed under the periphery of the pad as shown in FIG. 19, and the isolation layer 8 is maintained at the smallest operating potential so that the n⁻-layer 4a just under the bonding pad is an electrically floating island. With the thus constructed device, even if a defect B develops in the oxide film 10 under the bonding pad as shown in FIG. 19, and the pad and the n⁻-semiconductor layer 4a are short-circuited relative to each other, the signal is not allowed to flow into the semiconductor substrate but is effectively transmitted to a predetermined element region. The inventors of the present invention have studied the above technique extensively. FIG. 20 is a diagram showing the layout of a portion of an IC that was described by the inventors of the present invention based on the assumption that the device of FIG. 19 is embodied as a practical IC.

A common p-isolation layer 8a surrounds n⁻-layers 4a just under a plurality of pads 2a, 2b arranged close to a scribe region 24 in the peripheral portion of the semiconductor chip, and the isolation layer 8 is maintained at ground potential. The n⁻-layers 4a are floating islands which are surrounded by the isolation layer 8a. Reference numeral 4b denotes regions where there will be formed elements, such as npn-transistors, pnp-transistors, and diodes. The individual elements are isolated by an isolation layer 8b. All the regions 4b where elements are formed, are electrically isolated from other regions 4a, 4c. Reference numeral 5 denotes a p-diffusion resistance layer that is formed on the surface of a region 4c which consists of an n⁻-layer.

According to the study conducted by the inventors, peripheries of a plurality of pads are surrounded by the isolation layer 8a and, therefore, become dead space that cannot be used for forming elements. Furthermore, some space that exists among the pads must be filled with the isolation layer, imposing a limitation on increasing the density of integration.

Further, when there are several island regions consisting of diffusion resistances 5 as shown in FIG. 20, a power source contact must be provided for each of the island regions so that the power source potential Vcc is applied to the epitaxial n⁻-layers 4c that serve as island regions where the resistance will be formed. This restricts the freedom of wiring.

SUMMARY OF THE INVENTION

The present invention overcomes the aforementioned problems, and its primary object is to increase the degree of integration maintaining reliability, without increasing the chip area in a semiconductor device.

The above and other objects, as well as novel features of the present invention will become obvious from the description and the accompanying drawings of the specification.

A representative example of the invention disclosed in this specification will be briefly described below.

A semiconductor device has an electrically conductive film of a material such as aluminum containing bonding pads formed on an insulating film of a material such as $SiO_2$ that covers the surface of an n-silicon layer which is formed on one main surface of a single crystalline p-semiconductor substrate, the n-silicon layer having a conductivity type opposite to that of the semiconductor substrate. A p⁺-diffusion layer is provided on the surface of the n-silicon layer under the bonding pads. This enables the regions surrounding the bonding pads to be effectively utilized for forming the elements. Therefore, the degree of integration can be increased without increasing the chip area, and the above-mentioned object can be accomplished.

BRIEF DESCRIPTION OF THE DRAWINGS

FIGS. 1 and 2 illustrate an embodiment of the present invention, wherein FIG. 1 is a plan view of a region of bonding pads in a semiconductor device, and FIG. 2 is a section view cut along the line A—A' of FIG. 1;

FIG. 7 to 9 illustrate an embodiment of the present invention, wherein FIG. 7 is a plan view showing bonding pads and peripheral areas in the semiconductor device, FIG. 8 is a section view cut along the line X—X' of FIG. 7, and FIG. 9 is a plan view showing a diffusion pattern that corresponds to FIG. 7;

FIGS. 17 and 18 are plan views of an enlarged scale to compare the utilization of areas around the bonding pads in the IC of the present invention with that of the conventional IC, wherein FIG. 17 shows a conventional example, and FIG. 18 shows the case of the present invention;

DESCRIPTION OF THE PREFERRED EMBODIMENTS

FIGS. 1 to 6 are diagrams which illustrate the construction of the present invention.

Figure 3:
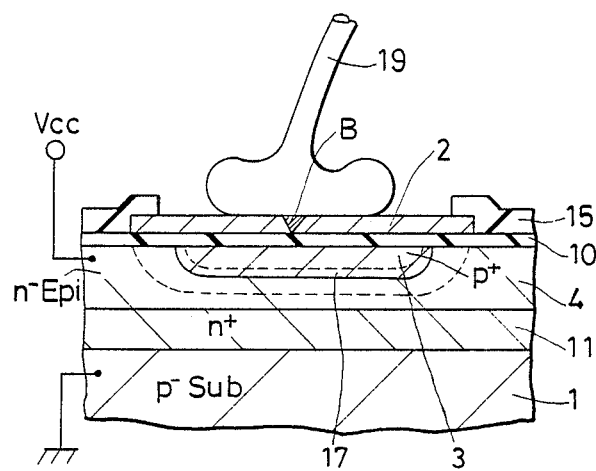
FIGS. 3 to 6 are section views for explaining the functions and effects of a semiconductor device according to an embodiment of the present invention.

According to the present invention as shown in FIG. 3, a p+-semiconductor region 3 is formed on the main surface of a semiconductor substrate under the bonding pad, the epitaxially grown n−-layer 4 and the p+-semiconductor region 3 are inversely biased relative to each other by applying the greatest operation potential to the epitaxially grown n−-layer, and that the p+-semiconductor region is electrically isolated from the epitaxially grown layer 4 and is floating. In this specification, the semiconductor substrate includes substrate 1, buried layer 11 and epitaxially grown layer 4.

With the device constructed as mentioned above, even when a portion of the semiconductor oxide film 10 becomes defective as denoted by B between the bonding pad 2 and the p+-semiconductor region 3 as shown in FIG. 3 and the wire 19 and the p+-semiconductor layer 3 are substantially short-circuited, the signal does not flow into the semiconductor substrate via the short-circuited path. As will be obvious from FIG. 3, the p+-semiconductor region which is formed under the bonding pad helps obtain the effects as mentioned above, and offers a distinct advantage over the conventional devices even from the standpoint of integration density. A more preferred embodiment of the invention will be described below.

Figure 2:
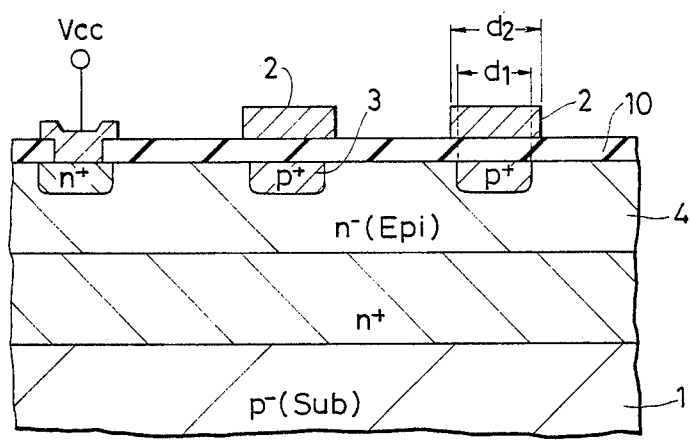

According to the preferred embodiment of the present invention as shown in FIGS. 2 and 3, the periphery of the p+-semiconductor region 3 is formed on the inside of the periphery of the bonding pad 2.

FIG. 3 is a section view showing, on an enlarged scale, the bonding pd according to the present invention, wherein reference numeral 1 denotes a semiconductor chip (substrate), 2 denotes an underlying layer of a bonding pad, 3 denotes a p+-diffusion layer formed under the pad, 4 denotes an n−-epitaxially grown layer to which a power-source potential is applied, 10 denotes a surface oxide film, and 15 denotes a polymide resin that serves as a passivation film.

By applying the power source potential to the epitaxially grown n−-layer 4, the p+-diffusion layer 3 under the pad 2 is reversely biased, whereby the depletion layer spreads as indicated by a dotted line from the pn-junction surface 17, and the p+-diffusion layer 3 is electrically isolated and floats, as described earlier.

In FIG. 3, note that the periphery of the p+-diffusion layer 3 does not reach the periphery of the pad 2, so that no channel will be formed for a parasitic MOS transistor. Under normal conditions where the oxide film 10 under the pad 2 is not destroyed, the region under the pad is floating, and no parasitic MOSFET develops.

Figure 4:
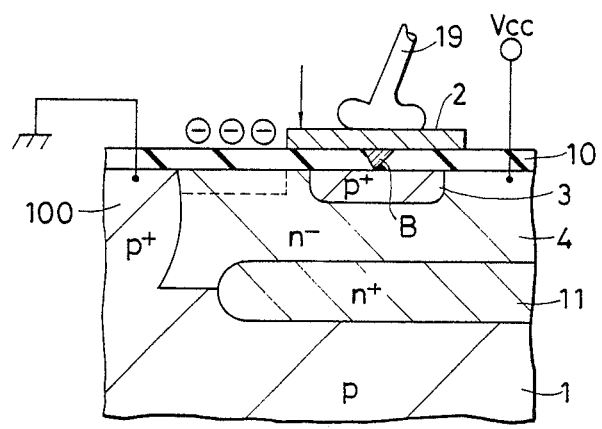

In case the oxide film 10 is destroyed at a point B in FIG. 4 due to the impact of wire bonding, the p+-diffusion layer 3 assumes the same potential as the pad 2. When the pad 2 assumes a high potential, the probability arises that the p+-diffusion layer 3 may be the source of a parasitic MOS transistor, and the isolation layer 100 that forms the island region may act as the drain. However, the p -layer does not exist in the region indicated by the arrow under the pad. In this region, therefore, a parasitic MOS transistor does not develop, i.e., the condition $V_S - V_G \geq V_{th}$. Namely, a parasitic MOS transistor does not develop under the condition $V_S - V_G = 0 < V_{th}$. That is, in FIG. 4, even when an electric charge of negative polarity (−) migrates from the aluminum wiring of a low potential, the channel is formed starting from a portion where no pad exists as indicated by a dotted line, and a parasitic MOS transistor does not develop.

Figure 5:
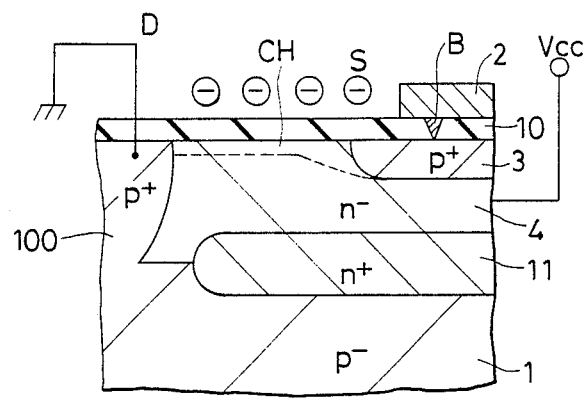

FIG. 5 shows the case where the p+-layer protrudes beyond the pad. In this case, a channel CH is formed on the surface of the n−-layer due to the electric charge (−) leaked from the low-potential aluminum wiring, and the p-layer under the pad serves as the source S and the p-isolation layer serves as the drain when the condition $V_G - V_S > V_{th}$ is satisfied. Therefore, a parasitic MOS transistor is likely to develop. According to the present invention, therefore, the periphery of the p+-semiconductor region 3 should be located inside the periphery of the pad 2, as described above.

Figure 6:
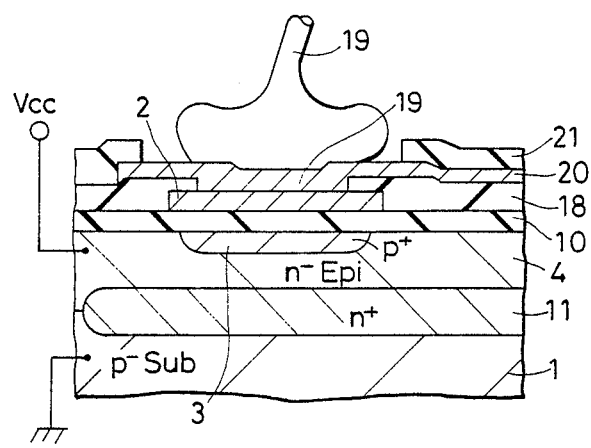

FIG. 6 is a section view showing the vicinity of the bonding pad in a semiconductor device having double-layer wiring construction according to another embodiment of the present invention.

In FIG. 6, reference numeral 1 denotes a chip, 2 denotes a first aluminum layer that lies under the bonding pad, and 18 denotes an inter-layer insulating film consisting of a polyimide resin. The resin film 18 has enough elasticity to absorb the impact when the wires are bonded. Being compounded by the use of the resin film as an inter-layer insulating film and the effect of the present invention, the IC is more reliable. In FIG. 6, reference numeral 29 denotes a second aluminum layer that serves as a bonding pad, 20 denotes a second wiring layer connected to the bonding pad 29, and 21 denotes a final protection film consisting of a polyimide resin.

Even in the case of this embodiment, the relation between the $p^+$-diffusion layer 3 and the first aluminum layer that lies under the bonding pad is the same as that of the one-layer wiring construction of FIG. 3, and the same effects are obtained as those of the aforementioned embodiment.

The effects of the invention will be explained below from the standpoint of enhancing the efficiency for utilizing the vicinity of the bonding pad.

Figure 1:
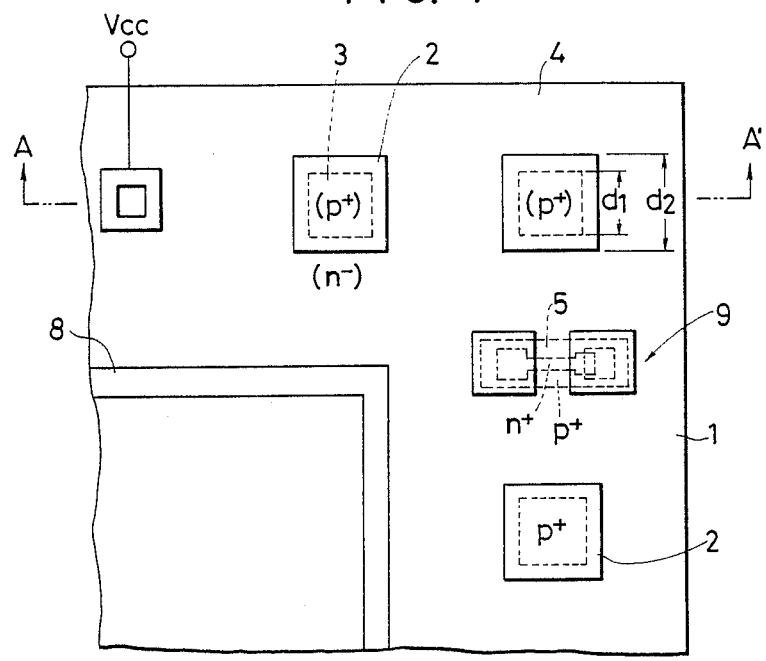

FIGS. 1 and 2 are diagrams showing an embodiment of the present invention, wherein FIG. 1 is a plan view showing the vicinity of bonding pads in a semi-conductor device, and FIG. 2 is a section view along the line A—A' of FIG. 1.

Figure 17:
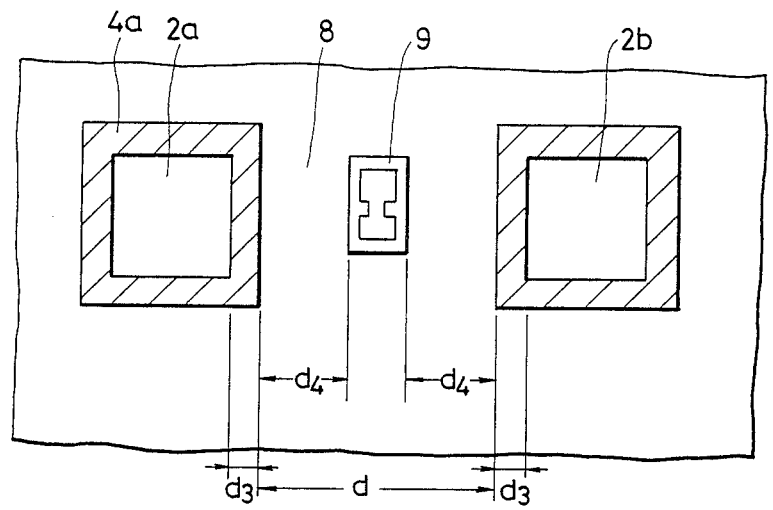
Figure 18:
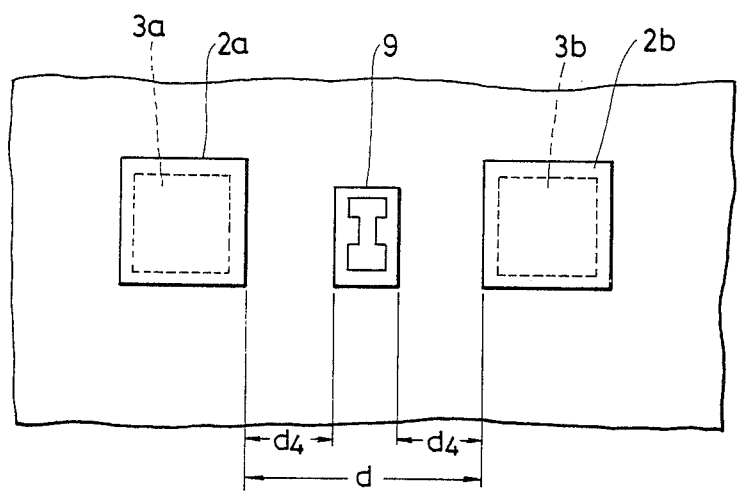
Figure 19:
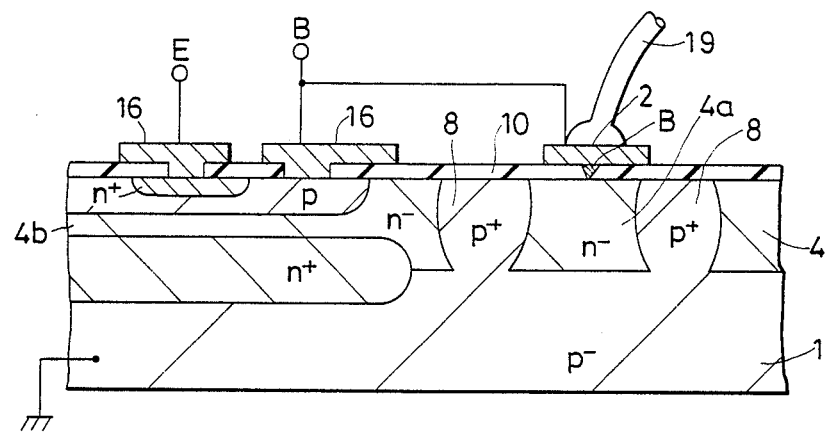
FIG. 19 is a section view showing the construction of a conventional semiconductor device to which the present invention is not adapted.

In FIG. 1, reference numeral 1 denotes a single crystalline silicon $p^-$-semiconductor substrate, 4 denotes an epitaxially grown silicon $n^-$-layer which is connected to the power source voltage Vcc, 3 denotes a $p^+$-diffusion layer, 8 denotes an isolation layer, 10 denotes a surface oxide film ($SiO_2$ film), and 2 denotes bonding pads composed of aluminum. The $p^+$-diffusion layer 3 is just under the bonding pad 2. The $p^+$ diffusion layer 3 has a width $d_1$ which is less than the width $d_2$ of the bonding pad, and its periphery is on the inside of the periphery of the bonding pad. From the conventional viewpoint of integration density, when an element is to be formed between the neighboring pads 2a and 2b as shown in FIG. 17, an isolation layer 4a having a width of, for example, $d_3 = 7.5$ μm must be provided around the pads, and an isolation margin having a width of, for example, $d_4 = 20$ μm must be provided around the isolation layer 4a. For this purpose, the distance d between the pads 2a and 2b must be greater than 60 μm, making it difficult to accomplish a high degree of integration. It is more advantageous from the standpoint of integration density to provide an isolation layer 8 only between the pads than to form an element (such as element 9 for preventing electrostatic breakdown) between the pads that are separated by more than 60 μm. According to the present invention, however, the $p^+$-diffusion layers 3a, 3b under the pads are floating, and there is no need to provide an isolation layer of the width of $d_3 = 7.5$ μm around the pads, as shown in FIG. 18. Therefore, the pads must be separated by a distance of, for example, $d = 50$ μm to form an element therebetween, making it possible to increase the degree of integration.

Figure 20:
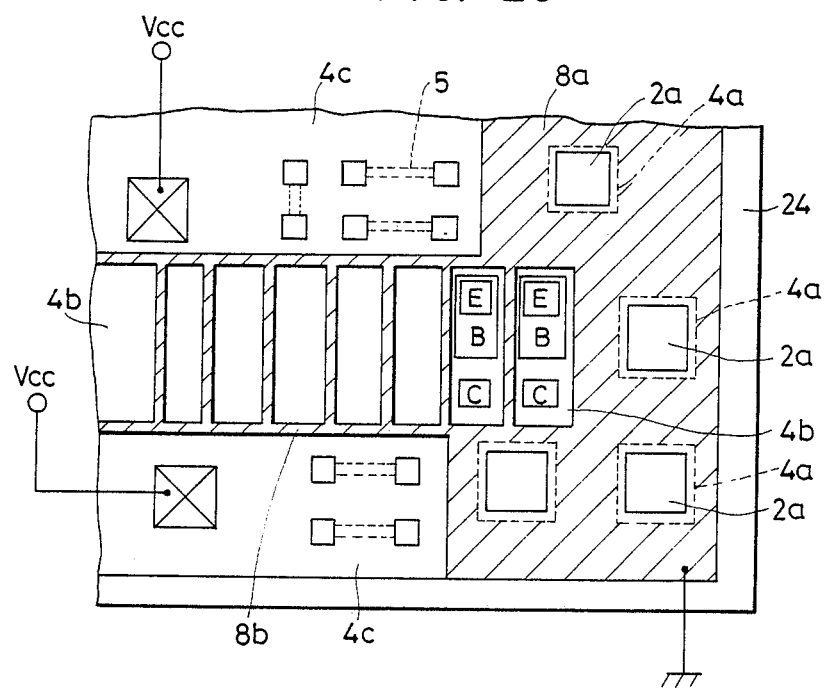
FIG. 20 is a plan view showing a layout of a semiconductor device that was described by the inventors of the present invention prior to accomplishing the present invention based upon a semiconductor device having sectional construction shown in FIG. 19.

Further, the degree of integration can be increased for other reasons. Since the $p^+$-type diffusion layer under the pad is floating, the epitaxial $n^-$-layer (island region) is maintained at the power source potential Vcc. Even when a p-type diffusion resistance or an element for preventing the electrostatic breakdown utilizing the pn junction is to be formed on the surface of the $n^-$-layer, it is necessary to maintain the $n^-$-layer at the power source potential. By utilizing this fact, regions having the same potential can be grouped together. Therefore, the wiring for maintaining the epitaxial layer at the power source potential must be provided in this region only (see FIG. 16), allowing increased freedom for wiring. So far, the wiring has been separately provided for each of the element-forming regions as shown in FIG. 20. In other words, there is no inconvenience from the standpoint of wiring even when many elements are formed in the same area.

Figure 16:
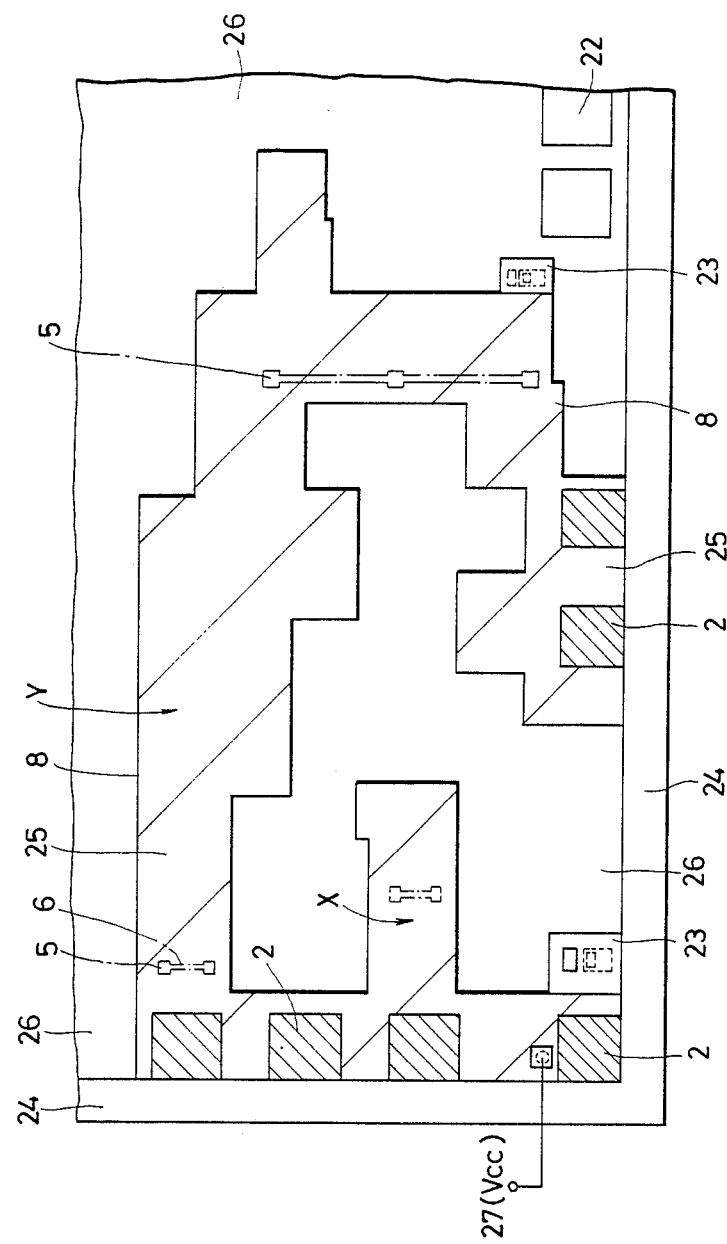
FIG. 16 is a plan view for explaining other functions and effects of a semiconductor device (IC) according to the present invention.

This is a very important feature of the present invention, and will be mentioned in further detail with reference to FIG. 16, wherein the bonding pads 2 indicated by hatched areas have a $p^+$-diffusion layer formed thereunder. Pads 22 which are not hatched do not have the $p^+$-layer formed thereunder. Reference numeral 5 denotes diffusion layers for resistors, 23 denotes elements such as npn transistors, and 24 denotes a peripheral scribe region.

In FIG. 16, the advantages of the present invention are accomplished due to the plurality of bonding pads 2 indicated by closely spaced hatching and a plurality of resistance elements 6 are formed in an island region 25 indicated by widely spaced hatching surrounded by an isolation layer 8 that is indicated by a thick line. To float the $p^+$-diffusion layer under the pad 2, the epitaxial $n^-$-layer 4 must be maintained at the power-source potential. The epitaxial $n^-$-layer must further be maintained at the power-source potential when a resistance element 6 is to be formed in the epitaxial $n^-$-layer by using a p-diffusion layer, or when an element for preventing electrostatic breakdown, that is not shown, is to be formed therein. This makes it possible to form the pads 2, resistance elements 6 and the like in a large region 25 surrounded by the isolation layer 8. Note also that in the conventional construction in which the isolation layer is formed around the pads, the resistance-forming layer is divided into two regions X and Y. According to the present invention, however, these regions are formed as one combined region, i.e., formed as a single region 25, to provide increased freedom for design. In the conventional art, furthermore, the contact electrode had to be provided for each of the two regions X, Y to maintain the epitaxial $n^-$-layers at the power-source potential. According to the present invention, however, the two regions X, Y are combined into one region, and only one contact electrode 27 need be formed to maintain the epitaxial $n^-$-layer contained in the region 25 at the power-source potential. Accordingly, layout of the wiring is facilitated.

Figure 8:
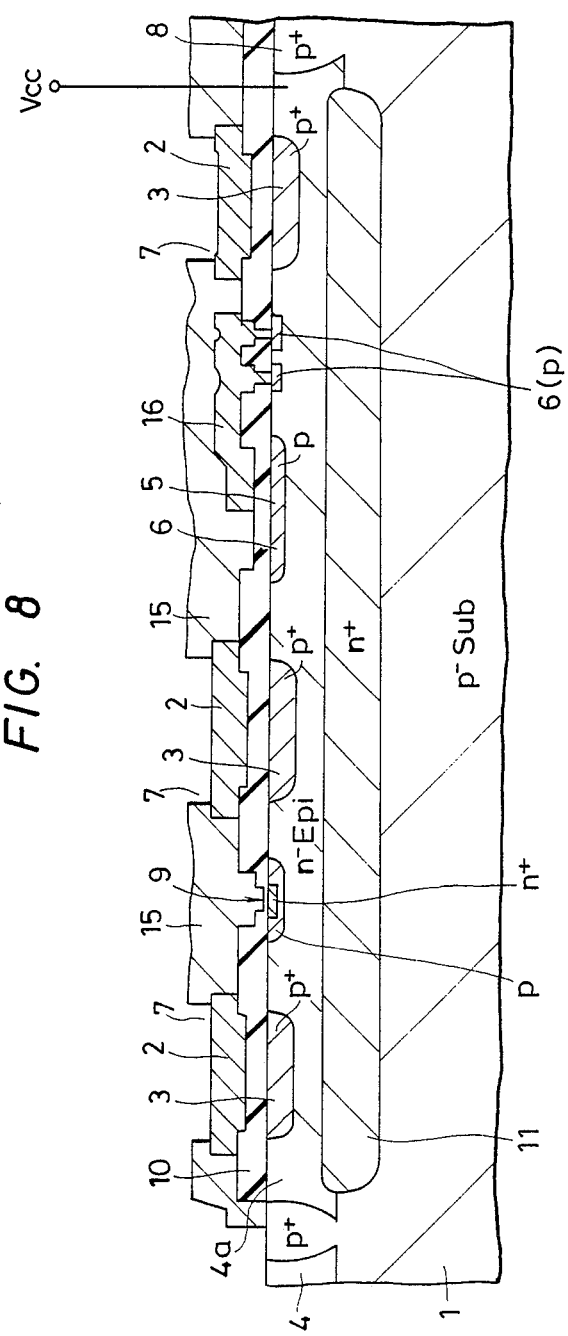
Figure 9:
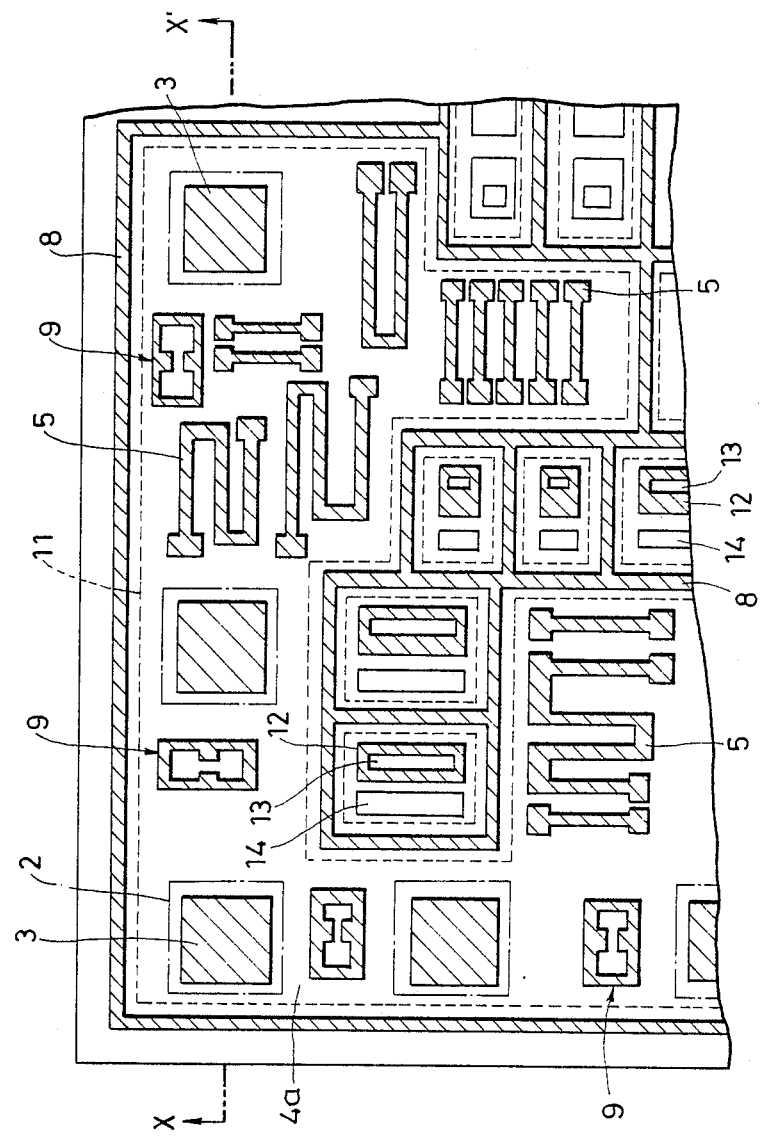

As shown in FIGS. 8 and 9, since there exists a buried $n^+$-layer having a small resistance between the epitaxial layer in the regions X, Y combined as a single region and the $p^-$-substrate, the regions X, Y are provided with nearly equal power. That is, by simply providing the buried $n^+$-layer having a small resistance in the bottom of the $n^-$-layer, large regions that are electrically isolated can be maintained at a constant potential. Therefore, reducing the number of lines connected to Vcc to one by combining the regions X, Y, presents no problem.

In FIG. 16, note that the same chip contains pads 2 with the $p^+$-diffusion layer 3 formed thereunder, and pads 22 without the $p^+$-diffusion layer formed thereunder.

That is, the present invention need not be adapted when the pads are to be formed in an element-forming region 26 other than the region 25 where the epitaxial layer is assuming the power-source potential. In short, when the elements are formed around the pads using the epitaxial $n^-$-layer as the power-source potential, the $p^+$-layer should be formed under the pads in accordance with the present invention. In other cases, the $p^+$-layer need not be formed.

FIG. 16 does not show the isolation layer that is formed in the region 26.

Figure 7:
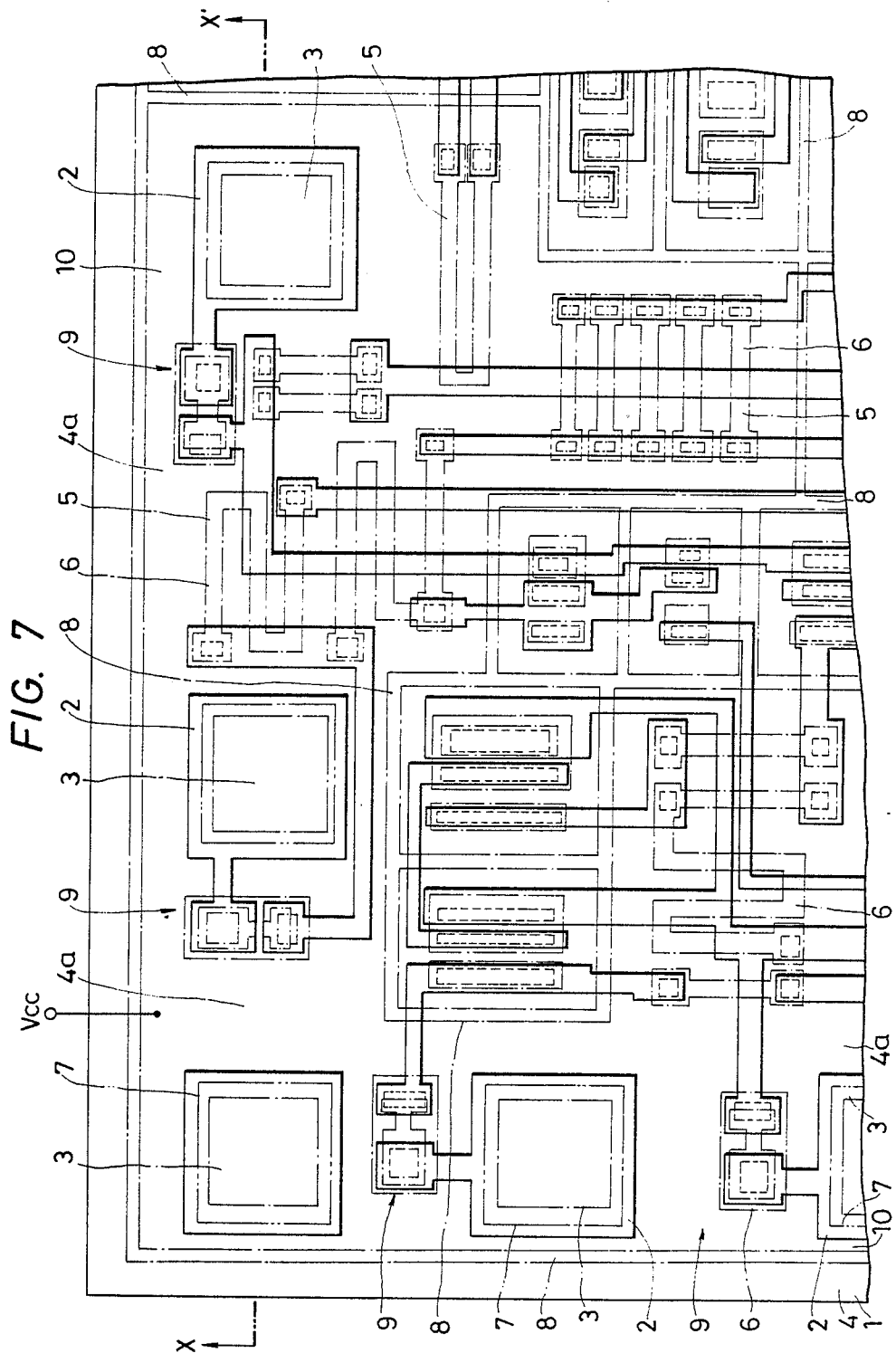

Contents of the invention will be described below in further detail in conjunction with several other drawings. FIG. 7 is a plan view showing a portion of an aluminum electrode pattern in the vicinity of bonding pads in a semiconductor device according to an embodiment of the present invention, and FIG. 8 is a section view along the line X—X' of FIG. 7.

Figure 23:
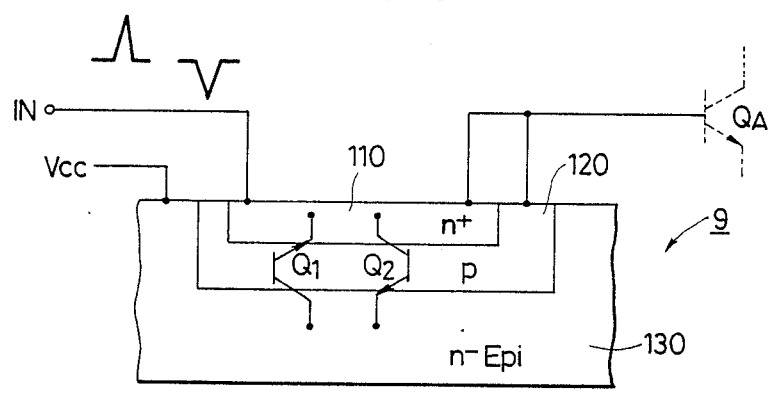
FIG. 23 is a sectional view showing the construction of an element which prevents electrostatic breakdown.

In FIG. 8, reference numeral 1 denotes a substrate which consists of a single crystalline p⁻-silicon on which the epitaxial n⁻-silicon layer (semiconductor layer) 4 is formed via a buried n⁺-layer 11. A portion 4a of the n⁻-silicon layer is electrically isolated from the other region 4 by the isolation p⁺-layer 8, and assumes the same potential as the power-source potential Vcc. Reference numeral 2 denotes bonding pads which consist of an aluminum film and which are formed on the p-silicon layer via a silicon oxide film (SiO₂ film) 10, 3 denotes p⁺-diffusion layers formed just under the bonding pads. The periphery of the p⁺-diffusion layers 3 is so formed as to be inside the periphery of the bonding pads 2. Reference numeral 5 denotes a diffusion layer for forming resistance, 6 denotes resistance elements, 16 denotes aluminum wiring, and 9 denotes an element for preventing electrostatic breakdown, which consists of a p-diffusion layer and an n⁺-diffusion layer. Details of the element for preventing electrostatic breakdown have been disclosed in Japanese Patent Publication No. 21838/1978. Construction and operation of this element will be briefly described below in conjunction with FIG. 23.

The element for preventing electrostatic breakdown is inserted between the bonding pad and an element $Q_A$ which receives a signal input through the bonding pad. When a large positive pulse is input to the input terminal IN, a parasitic transistor $Q_2$ is turned on, so that the positive pulse is allowed to flow into the epitaxial n-layer 130. When a negative pulse is input to the input terminal IN, a transistor $Q_1$ is turned on, whereby the electric current is sucked from the epitaxial n-layer 130 to offset the negative pulse. Thus, the element for preventing electrostatic breakdown utilizes parasitic transistors to protect semiconductor element $Q_A$ from positive and negative pulses.

Reference numeral 10 denotes a surface oxide film (SiO₂ film), 15 denotes a passivation film of a material such as polyimide resin, and 7 denotes through-holes formed in the passivation film 15. The surface of the bonding pads 2 are exposed through the holes 7.

FIG. 9 is a plan view showing a diffusion pattern that corresponds to a diffusion portion indicated by a solid line in FIG. 1, wherein hatched portions represent p-type diffusion layers such as p⁺-isolation layer 8, p⁺-layer 3 under the bonding pads, and p-diffusion layer 5 for resistance. Reference numeral 12 denotes a p-diffusion layer that serves as the base of an npn-transistor element, 13 denotes an n⁺-diffusion layer that serves as the emitter, and 14 denotes a diffusion layer for taking out the collector electrode.

In FIG. 9, the broken line 11 indicates the peripheral position of the buried n⁺-layer.

In FIGS. 7 to 9 in which the p⁺-diffusion layers 3 are present under the bonding pads 2, if the epitaxial n⁻-layer 4a of these portions is served with the power-source potential Vcc, only the p⁺-diffusion layers 3 under the bonding pads are electrically floated.

That is, it is permissible to form elements such as element 9 for preventing electrostatic breakdown and resistance element 5 that use an epitaxial n⁻-layer as a power-source potential in the vicinity of pads 2.

Therefore, the region near pads 2 can be effectively used for forming elements, making it possible to reduce the area of the chip 1 and to increase the degree of integration.

As shown in FIG. 8, furthermore, the oxide film 10 has been formed so thickly on the p⁺-diffusion layer 3 under the pad in the initial step of formation that it is not easily damaged by the bonding pad.

For this purpose, the p⁺-diffusion layer 3 that floats should be formed in the first step of forming the p⁺-diffusion layer after the isolation layer 8 has been formed. According to the process for forming IC's which contain analog as well as digital circuits employed by the inventors, the p⁺-diffusion layer is formed simultaneously with the formation of the p⁺-diffusion layer in the injector of IIL (integrated injection logic) in the digital portion.

By forming the p⁺-diffusion layer 3 in an early stage, the oxide film 10 on the p⁺-diffusion layer 3 is thick due to the heat-treatment for the base diffusion and emitter diffusion. Therefore, the oxide film becomes thick enough not to be damaged even when the impact of bonding is imparted thereto.

FIGS. 10 to 15 are section views showing the steps of a process for producing bipolar IC's with IIL elements having bonding pad regions according to another embodiment of the present invention.

Each of the steps will be described below.

Figure 10:
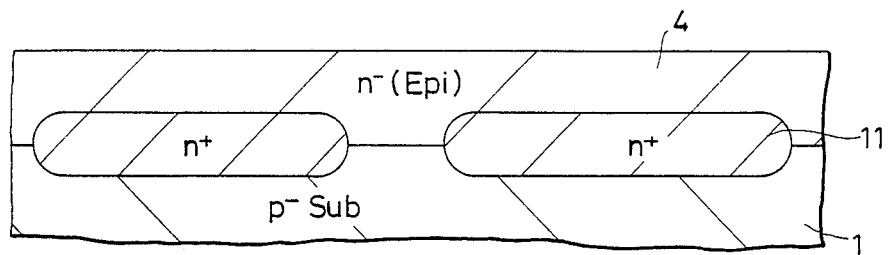
FIGS. 10 to 15 are section views illustrating steps in a process for manufacturing semiconductor devices having an IIL according to another embodiment of the present invention.

(a) Buried n⁺-layers (sheet resistance of 20±8 ohms.cm) 11 are formed by local donor diffusion on a single crystalline silicon p⁻-substrate (resistivity 20 ohms.cm to 50 ohms.cm) 1 as shown in FIG. 10, and an n⁺-silicon layer (thickness 4 to 5.8 μm and resistivity 0.7 ohm cm) is epitaxially grown to bury the layer 11, according to an ordinary bipolar IC process. Then, heat-treatment is effected at 1100° C. for about 110 minutes in an oxygen atmosphere to form a surface oxide film having a thickness of about 8000 angstroms.

Figure 11:
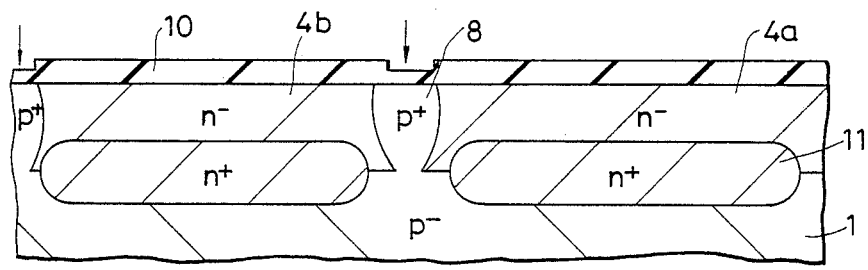

(b) A portion of the surface oxide film 10 is opened, acceptor impurities such as boron ions are deposited at 1045° C. and are diffused through a subsequent heat-treatment (1000° C. for 20 minutes) to form a p-isolation layer 8 as shown in FIG. 11.

Figure 12:
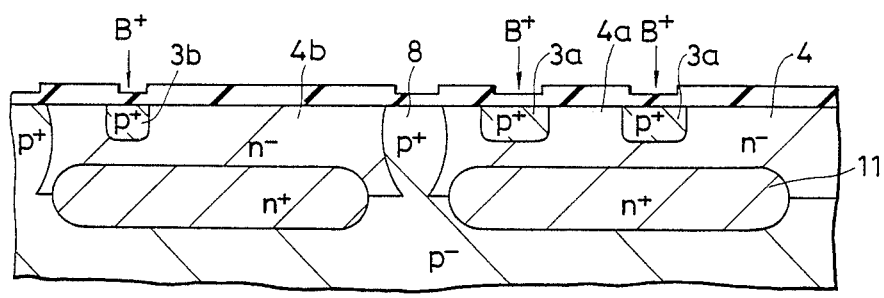

(c) A portion of the oxide film 10 is selectively opened through the treatment using a photoresist, and boron ions are deposited at 1045° C. and are diffused at 950° C. in a wet oxygen atmosphere as shown in FIG. 12. The diffusion layer has a sheet resistance of 12 to 14 ohms.cm. A p⁺-layer 3b that serves as an IIL injector is formed in one region 4b. At the same time, a p⁺-layer 3a bonding pad that will float is formed in the other region 4a.

Figure 13:
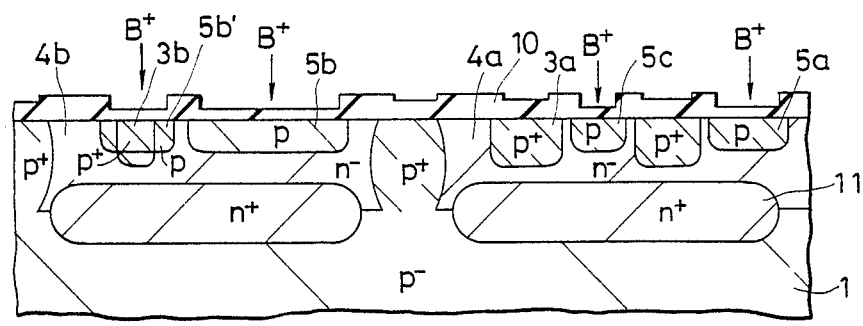

(d) Next, the oxide film of a desired portion is etched, and boron ions are deposited at a temperature of 980° C. for 20 minutes in a mercury atmosphere of 0.04 mmHg. Then, the base diffusion (BR diffusion) is effected to form a p-layer having a sheet resistance of $\rho s = 175$ ohms/cm². Thus, a p-layer 5b' for the injector and a p-layer 5b that serves as the base of an inverse npn-transistor are formed on the IIL side as shown in FIG. 13. On the side of the bonding pad region, a p-layer 5c for forming an element for preventing electrostatic breakdown and a p-layer 5a for forming resistance are formed.

Figure 14:
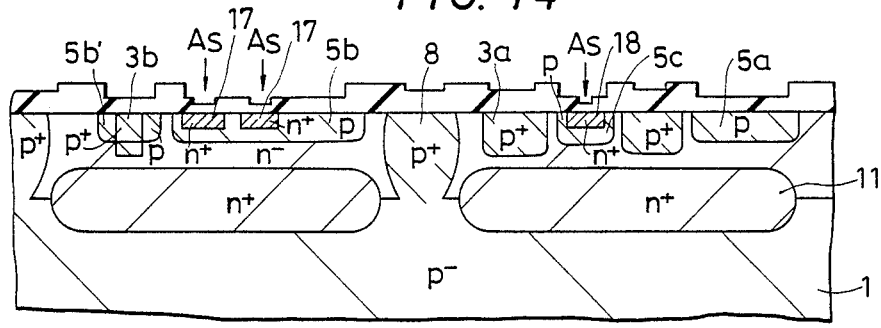

(e) The oxide film is removed from the emitter portion, and a phosphosilicate glass is grown at 1100° C. for 30 minutes. Then, diffusion is effected through a heat-treatment of 1050° C. for about 15 minutes to form an n+-multicollector layer 17 having a sheet resistance of 8.4 ohms/cm² on the IIL side. At the same time, an n+-layer 18 for an element for preventing electrostatic breakdown is formed on the side of the bonding pad as shown in FIG. 14.

Figure 15:
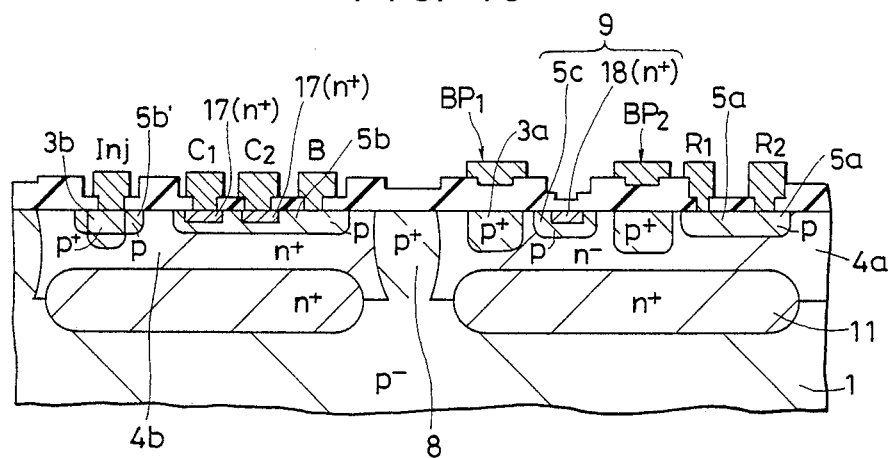

(f) After contact photoetching, aluminum is vaporized to effect etching for patterning, whereby an injector electrode Inj, multicollector electrodes $C_1$, $C_2$ and a base electrode B are formed on the IIL side as shown in FIG. 15 and, at the same time, bonding pads $BP_1$, $BP_2$ and diffusion resistance terminals $R_1$, $R_2$ are formed on the side of the bonding pad region. Then, though not diagrammed, a protection film composed of a polyimide resin is formed, and the bonding pads $BP_1$, $BP_2$ are exposed by selective etching.

As will be obvious from the IIL process described above, the oxide film 10 under the bonding pad is thick enough through the diffusion steps such as p-base diffusion and multicollector (emitter) diffusion, after the diffusion layer 3a to be floated is formed simultaneously with injector diffusion.

The surface oxide film formed by ordinary base diffusion (BR diffusion) has a thickness of about 5000 angstroms. However, the surface oxide film of the IIL injector has a thickness of about 80,000 angstroms, and can sufficiently withstand the impact of bonding.

Summarized below are the effects of the present invention described in the above embodiments.

(1) By permitting only the p+-diffusion layer under the bonding pad to float, it is possible to prevent other electronic circuits from being adversely affected in case the pad and the semiconductor layer are shortcircuited by the impact of bonding. Moreover, the region of the pads can be effectively utilized as regions for forming elements.

(2) Elements can be formed among the pads owing to the reasons mentioned in (1) above. Therefore, the degree of integration of the IC can be increased without increasing the chip areas.

(3) Since the p+-diffusion layer under the bonding pad is floating, elements such as resistors can be formed in a single power-source potential region by utilizing the epitaxial layer under the pads as the power-source potential, i.e., by using the epitaxial layer that is an island region as the power-source potential. Therefore, more freedom is offered for designing the circuit.

(4) Because of the reasons mentioned in (3) above, only one contact electrode need be provided to utilize the epitaxial layer as the power-source potential, thereby further increasing the degree of freedom for wiring.

Although the invention accomplished by the inventors was described in the foregoing by way of embodiments, it should be noted that the present invention is in no way limited to the above-mentioned embodiments only, but can be modified in a variety of other ways without departing from the spirit and scope of the invention.

Further, construction of the present invention presents effects as described below.

The p+-diffusion layer formed under the bonding pad reduces capacity.

Figure 21:
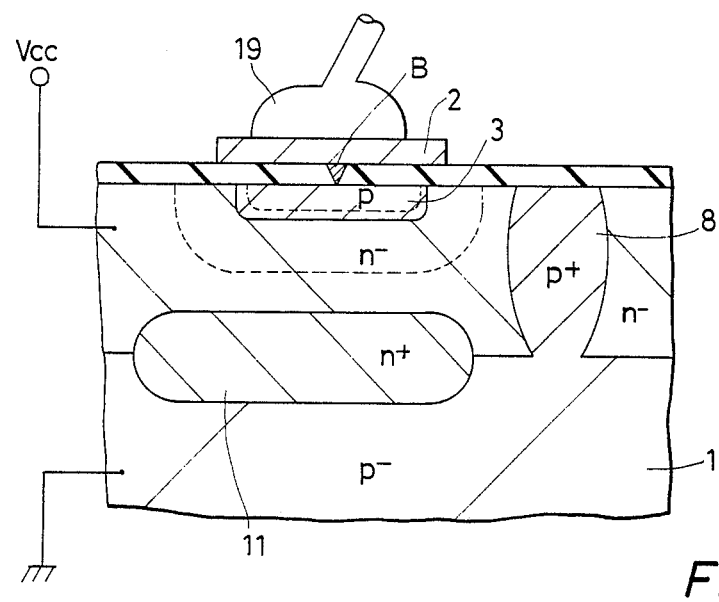
FIG. 21 is a sectional view showing further effects of the semiconductor device of the present invention.
Figure 22:
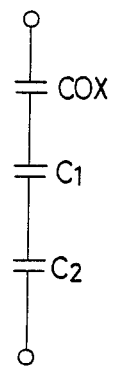
FIG. 22 is a circuit diagram which is equivalent to FIG. 21.

That is, the semiconductor device having bonding pad construction shown in FIG. 21 can be simulated by capacitors connected in series as shown in FIG. 22, wherein Cox denotes the capacity of the oxide film, $C_1$ denotes the capacity of the depletion layer spreading between the epitaxial layers, and $C_2$ denotes the capacity between the n+-substrate and the p⁻-substrate. The sum of capacities of Cox, $C_1$ and $C_2$ connected in series is represented by, $$Ctot = Cox.C_1.C_2/(Cox.C_1+C_1.C_2+C_2.Cox)$$

Namely, the capacity under the pad is smaller than the capacity $Ctot=Cox.C_2/(Cox+C_2)$ when there is no p+-diffusion layer. Thus, as the capacity decreases under the pad, operating speed of the semiconductor device increases, thereby exhibiting improved characteristics.

Although the above description has dealt with the case where the invention accomplished by the inventors was adapted to a semiconductor device that served as the background of the invention, the invention should not be limited thereto only.

The present invention can be adapted to general linear IC's and MCS IC's, and is particularly effective for the linear pulse digital IC's in general.

The invention can further be effectively adapted to semiconductor substrates without an epitaxial layer.

What is claimed is:
1. A semiconductor device comprising:
   (1) an island region of a first type of conductivity selectively formed on a semiconductor substrate of a second conductivity type opposite to the first conductivity type, the island region being electrically connected to a power source;
   (2) a semiconductor region of the second type of conductivity formed in said island region, said semiconductor region being electrically separated from said semiconductor substrate;
   (3) an insulating film formed on surfaces of said semiconductor region, said island region and said semiconductor substrate;
   (4) a bonding pad formed on a portion of said insulating film located over said semiconductor region so that said bonding pad is electrically separated from said semiconductor region; and
   (5) a bonding wire connected to said bonding pad;
   wherein said semiconductor region of the second type of conductivity, in plan view, is located, in its entirety, inside of the periphery of the bonding pad that exists over said semiconductor region of the second type of conductivity, so that, in plan view, the entire periphery of the semiconductor region is spaced from, and inside of, the entire periphery of the bonding pad.

2. A semiconductor device according to claim 1, wherein said island region of the first type of conductivity comprises an n-semiconductor, said semiconductor region of the second type of conductivity comprises a p-semiconductor, and said island region of the first type of conductivity is maintained at the greatest operating potential.

3. A semiconductor device according to claim 1, further comprising other island regions of the first type of conductivity formed in the substrate, whereby a plurality of island regions of the first type of conductivity are provided in the substrate, said island region of the first type of conductivity being electrically isolated from said other island regions.

4. A semiconductor device according to claim 1, wherein the bonding pad comprises aluminum, the insulating film comprises a silicon dioxide film, and the semiconductor region of the second type of conductivity comprising a semiconductor region into which impurities are introduced at a high concentration.

5. A semiconductor device according to claim 1, further comprising a buried layer of the first type of conductivity formed under said island region, said buried layer having an impurity concentration higher than that of said island region.

6. A semiconductor device according to claim 1, wherein the bonding pad comprises a single metal layer.

7. A semiconductor device according to claim 5, further comprising at least one semiconductor element formed in said island region of the first type of conductivity, and in a first semiconductor layer of the second type of conductivity that is spaced from said semiconductor region formed below said bonding pad.

8. A semiconductor device according to claim 7, further including a resistor formed by utilizing said first semiconductor layer of the second type of conductivity.

9. A semiconductor device according to claim 7, wherein said at least one semiconductor element includes an electrostatic breakdown prevention element, and is comprised of the semiconductor layer of the second type of conductivity formed in said island region of the first type of conductivity and a semiconductor layer of the first type of conductivity formed in said semiconductor layer of the second type of conductivity, and wherein an end of the semiconductor layer of the first type of conductivity serves as an input terminal for receiving signals, and a commonly connected end of said semiconductor layer of the first type of conductivity and said semiconductor layer of the second type of conductivity serves as an output terminal.

10. A semiconductor device according to claim 1, wherein said semiconductor region of a second type of conductivity is electrically isolated from the island region of the first type of conductivity and floats.

11. A semiconductor device according to claim 1, further comprising at least one semiconductor element formed in said island region of the first type of conductivity.

12. A semiconductor device according to claim 1, further comprising a power source means for applying a predetermined potential, and wiring means for applying said predetermined potential from said power source means to said island region of a first type of conductivity.

13. A semiconductor device according to claim 12, further comprising at least one semiconductor element formed in said island region of the first type of conductivity.

14. A semiconductor device according to claim 13, wherein said at least one semiconductor element includes at least one semiconductor element using, as a semiconductor region thereof, said island region of a first type of conductivity, so as to apply said predetermined potential to the at least one semiconductor element using the island region as a semiconductor region thereof.

15. A semiconductor device according to claim 3, wherein the island region of the first type of conductivity is electrically isolate from the other island regions by an isolation layer of the second type of conductivity.

16. A semiconductor device according to claim 3, further comprising semiconductor elements formed in said other island regions, at least one of the semiconductor elements formed in the other island regions including a region of second type of conductivity, and wherein the depth from the substrate surface of the region of second type of conductivity of the at least one element in the other island regions is substantially equal to the depth from the substrate surface of the semiconductor region of a second type of conductivity formed in the island region.

17. A semiconductor device according to claim 11, wherein said at least one semiconductor element includes a resistor formed by utilizing a further semiconductor region of the second type of conductivity.

18. A semiconductor device according to claim 11, wherein said at least one semiconductor element includes an electrostatic breakdown prevention element, and is comprised of a further semiconductor region of the second type of conductivity formed in said island region of the first type of conductivity and a semiconductor region of the first type of conductivity formed in said semiconductor region of the second type of conductivity, and wherein an end of the semiconductor region of the first type of conductivity serves as an input terminal for receiving signals, and a commonly connected end of said semiconductor region of the first type of conductivity and said further semiconductor region of the second type of conductivity serves as an output terminal.

19. A semiconductor device comprising:
  (1) an island region of a first type of conductivity formed on a semiconductor substrate of a second type of conductivity opposite to the first type of conductivity, the island region being electricity connected to a power source;
  (2) a semiconductor region of the second type of conductivity formed in said island region, said semiconductor region being spaced from the semiconductor substrate;
  (3) an insulating film formed on surfaces of said semiconductor region, said island region and said semiconductor substrate;
  (4) a bonding pad formed on a portion of said insulating film located over said semiconductor region so that said bonding pad is electrically separated from said semiconductor region; and
  (5) a bonding wire connected to said bonding pad;
  wherein said semiconductor region of the second type of conductivity, in plan view, is located, in its entirety, inside of the periphery of the bonding pad that exists over said semiconductor region of the second type of conductivity, so that, in plan view, the entire periphery of said semiconductor region is spaced from, and inside of, the entire periphery of the bonding pad; and wherein said bonding pad includes first and second metal layers, the first metal layer being formed on said insulating film and the second metal layer being formed on the first metal layer.

20. A semiconductor device according to claim 19, further comprising an intermediate film formed on the surface of said insulating film and on the surface of the periphery of said first metal layer, said intermediate film extending between the first and second metal layers at the periphery of the first metal layer, the intermediate film including a resin film.

21. A semiconductor device according to claim 20, wherein the resin film is composed of a polyimide resin.

22. A semiconductor device comprising:

(1) an island region of an n-semiconductor selectively formed on a semiconductor substrate of a p-semiconductor, said island region being maintained at the greatest operating potential;

(2) a plurality of semiconductor regions of a p-semiconductor formed in said island region, said plurality of semiconductor regions each being electrically separated from said semiconductor substrate;

(3) a buried layer of n-semiconductor formed under said island region, said buried layer having an impurity concentration higher than that of said island region;

(4) an insulating film formed on surfaces of said plurality of semiconductor regions, said island region and said semiconductor substrate;

(5) respective bonding pads formed on a portion of said insulating film located over said plurality of semiconductor regions so that each of said bonding pads is electrically separated from said plurality of semiconductor regions;

(6) bonding wires connected to respective bonding pads;

(7) a power source means for applying a predetermined potential, and wiring means for applying said predetermined potential from said power source means to said island region; and (8) at least one semiconductor element formed in said island region of n-semiconductor; said plurality of semiconductor regions of the p-semiconductor, in plan view, is located, in its entirety, inside of the periphery of the bonding pad that exists over a respective semiconductor region of the p-semiconductor, so that, in plan view, the entire periphery of each of the semiconductor regions is spaced from, and inside of, the entire periphery of the respective bonding pad.

23. A semiconductor device according to claim 22, wherein said at least one semiconductor element is formed at a portion of said island region between said plurality of semiconductor regions of the p-semiconductor.

24. A semiconductor device comprising:

(1) an island region of an n-semiconductor selectively formed on a semiconductor substrate of a p-semiconductor, said island region being maintained at the greatest operating potential;

(2) a semiconductor region of a p-semiconductor formed in said island region, said semiconductor region being electrically separated from said semiconductor substrate;

(3) a buried layer of n-semiconductor formed under said island region, said buried layer having an impurity concentration higher than that of said island region;

(4) an insulating film formed on surfaces of said semiconductor region, said island region and said semiconductor substrate;

(5) a bonding pad formed on a portion of said insulating film located over said semiconductor region so that said bonding pad is electrically separated from said semiconductor region;

(6) a bonding wire connected to said bonding pad;

(7) a power source means for applying a predetermined potential, and wiring means for applying said predetermined potential from said power source means to said island region; and (8) at least one semiconductor element formed in said island region of an n-semiconductor and in a first semiconductor region of p-semiconductor that is spaced from the semiconductor region formed below the bonding pad;

wherein said semiconductor region of the p-semiconductor, in plan view, is located, in its entirety, inside of the periphery of the bonding pad that exists over said semiconductor region of the p-semiconductor, so that, in plan view, the entire periphery of the semiconductor region is spaced from, and inside of, the entire periphery of the bonding pad.

* * * * *